United States Patent [19]
Sakurai

[11] Patent Number: 5,990,754
[45] Date of Patent: Nov. 23, 1999

[54] PHASE AND BASE POTENTIAL CONVERTER AND TEMPERATURE-COMPENSATED CRYSTAL OSCILLATOR HAVING THE SAME

[75] Inventor: Yasuhiro Sakurai, Sayama, Japan

[73] Assignee: Citizen Watch Co., Ltd., Tokyo, Japan

[21] Appl. No.: 09/098,698

[22] Filed: Jun. 18, 1998

[30] Foreign Application Priority Data

Jun. 20, 1997 [JP] Japan .................................. 9-164156
Jul. 2, 1997 [JP] Japan .................................. 9-177004

[51] Int. Cl.$^6$ ...................................................... H03B 5/32
[52] U.S. Cl. ........................... 331/158; 331/176; 327/530
[58] Field of Search ................................. 331/158, 116 R, 331/116 FE, 176, 177 R, 66, 177 V, 117 FE, 117 R; 327/530, 538, 543

[56] References Cited

U.S. PATENT DOCUMENTS 4,152,716  5/1979  Torii et al. ................................. 357/41
5,592,119  1/1997  Yoo ......................................... 327/530

OTHER PUBLICATIONS

Herbert Taub and Donald Schilling, Digital Integrated Electronics, p. 193, 1977.

*Primary Examiner*—Robert Pascal
*Assistant Examiner*—Henry Choe
*Attorney, Agent, or Firm*—Armstrong, Westerman, Hattori, McLeland & Naughton

[57] ABSTRACT

A phase and base potential converter according to the invention is constructed as follows. Two MOS transistors having the same size and characteristic are connected in series between a first power supply and a second power supply, a gate of one MOS transistor is served as an input terminal of a voltage based on the first power supply, and a source of the other MOS transistor is served as an output terminal of a voltage based on the second power supply. One of the first power supply or the second power supply is a lower potential power supply, and the other is a higher potential power supply. The phase and base potential converter being thus constructed makes it possible to convert, for example, a signal based on the Vss into a signal based on the Vdd and thereby synthesize signals having different base potentials.

6 Claims, 3 Drawing Sheets

PHASE AND BASE POTENTIAL CONVERTER AND TEMPERATURE-COMPENSATED CRYSTAL OSCILLATOR HAVING THE SAME

BACKGROUND OF THE INVENTION

1. Field of the Invention

The present invention relates to a phase and base potential converter that converts a voltage of a first power supply base into a voltage of a second power supply base and a temperature-compensated crystal oscillator containing the converter as a phase and base potential converter of a frequency control signal, specifically to a construction of a temperature-compensated crystal oscillator having a frequency adjusting function by an external frequency control signal, incorporated in a communication device such as a portable telephone.

2. Description of the Related Art

Various electronic equipment now being used include the Vss base system in which the lower potential power supply (ground or VSS) is served as the base of the analog signal, and the Vdd base system in which the higher potential power supply (Vcc or Vdd) is served as the base of the analog signal. However, most electronic equipment adopts the Vss base system, and only some, such as a crystal watch, adopt the Vdd base system.

The reason why a crystal watch adopts the Vdd base system is as follows.

The crystal watch is an electronic device having a crystal oscillator integrated therein, and its power consumption has to be low. Accordingly, the crystal oscillator is constructed with complementary field effect transistor (CMOS).

Where the crystal oscillator comprises with CMOS transistor, in view of the oscillation starting characteristic and the power consumption, it is preferable to construct the oscillator so as to balance as much as possible the drive capability and gate capacitance, etc., between the p-channel MOS transistor and the n-channel MOS transistor constituting the oscillation inverter.

However, due to the difference between the mobility of electrons and that of holes, to obtain the equivalent drive capability necessarily requires the channel width of the p-channel MOS transistor be designed to be wider than that of the n-channel MOS transistor.

Accordingly, to balance the drive capability of the p-channel MOS transistor against that of the n-channel MOS transistor in the foregoing manner will lead to an imbalance of the gate capacity.

In order to control the imbalance to a low level as much as possible, it is necessary to reduce the difference between the mobility of electrons and that of holes as much as possible.

And, in the MOS transistor, as the impurity concentration in the channel region is high, the mobilities of electrons and holes become low.

Accordingly, it is preferable that the concentration of the p-type semiconductor substrate where the n-channel MOS transistor is formed be set higher than the concentration of the n-type semiconductor substrate where the p-channel MOS transistor is formed.

To achieve the foregoing, one of the simplest methods is to form the n-type semiconductor substrate as a starting material and on the surface thereof to selectively form a p-type diffusion region called the p-well as the region where the n-channel MOS transistor is formed.

In the case of a CMOS, all the pn junctions have to be reversely biased, and the semiconductor substrate is served as the base for the analog signal. Therefore, an electronic device constructed with a CMOS in which the n-type semiconductor substrate is formed as the starting material necessarily makes use of the Vdd base system in which the higher potential power supply is served as the base.

This is the reason that the crystal watch takes on the Vdd base system. In addition, not only the crystal watch, but crystal oscillators constructed with a CMOS, employ the Vdd base system in general.

Incidentally, in the temperature-compensated crystal oscillator incorporated in a communication device such as a portable telephone, an AT-cut crystal unit to cover the 10 MHz band is used as the source of vibration, a frequency adjusting circuit is applied to the source of vibration to make up a temperature compensation circuit, and the temperature characteristic of a tertiary curve of the AT-cut crystal unit is canceled. Thereby, the oscillation frequency of the temperature-compensated crystal oscillator is stabilized.

This type of temperature-compensated crystal oscillator has been comprised in most cases with an amplifier using bipolar transistors and a temperature compensation circuit composed of the series-parallel connection of a thermistor and capacitors; however recently, the temperature-compensated crystal oscillator constructed with a CMOS integrated circuit has become widely used.

The reason why the temperature-compensated crystal oscillator is constructed with a CMOS integrated circuit lies in that the improvement of performance and cost reduction can be achieved by freely using a technique such as analog signal synthesis.

In the case where the temperature-compensated crystal oscillator is constructed with a CMOS integrated circuit, from the consideration of the oscillation starting characteristic, for example, it is advantageous that the temperature-compensated crystal oscillator uses the Vdd base system, in which the n-type semiconductor substrate is formed as the starting material as mentioned above.

Incidentally, depending on the specification of the portable telephone, it is a usual exercise to apply an external frequency control signal to the temperature-compensated crystal oscillator and to thereby compensate for aging, etc.

In the temperature-compensated crystal oscillator incorporated in the portable telephone of such a specification, the temperature compensation and the external frequency control interfere each other, which can cause harmful effects such as lowering the frequency accuracy, etc.

One method for eliminating the mutual interference between the temperature compensation and the external frequency control is to synthesize the temperature compensation signal and the external frequency control signal and control a variable capacitance circuit, for example, by the composite signal thus synthesized, and thereby adjust the oscillation frequency of the crystal oscillating circuit.

However, the main body of a portable telephone uses the Vss base system, and the frequency control signal applied to the temperature-compensated crystal oscillator for compensating the aging, etc., is an analog voltage signal of the Vss (ground potential) base.

Therefore, in order to eliminate the mutual interference between the temperature compensation and the external frequency control by synthesizing the frequency control signal and the temperature compensation signal, the temperature-compensated crystal oscillator must be constructed with a CMOS integrated circuit of the Vss base.

However, to construct the temperature-compensated crystal oscillator with a CMOS integrated circuit of the Vss base will lead to increasing the imbalance between the gate capacitance of the p-channel MOS transistor and that of the n-channel MOS transistor constituting the oscillation inverter, as mentioned above, which invites disadvantages in terms of the oscillation characteristic such as the oscillation starting characteristic and power consumption, etc.

Therefore, if priority is given to the oscillation characteristic, the signal composition of the external frequency control signal and the temperature compensation signal was degraded.

That is, if the temperature-compensated crystal oscillator used in the environment of the Vss base system is constructed with a CMOS integrated circuit, there has been a problem in that either the oscillation characteristic or the signal composition for preventing the mutual interference had to be sacrificed.

SUMMARY OF THE INVENTION

The present invention has been made in view of the foregoing problems, and an object of the invention is to provide a phase and base potential converter that enables proper signal composition between signals of different base potentials, and to enhance the oscillation characteristic of the temperature-compensated crystal oscillator constructed with a CMOS integrated circuit as well as to eliminate the mutual interference between the temperature compensation and the external frequency control.

In order to accomplish the foregoing object, the construction of the phase and base potential converter according to the invention is as follows.

A first MOS transistor having four terminals of the source, drain, gate, and bulk, and a second MOS, transistor having the same size and the same characteristic as the first MOS transistor are provided. The source and the bulk of the first MOS transistor are connected to a first power supply, the source and the bulk of the second MOS transistor are connected to the drain of the first MOS transistor, and the gate and the drain of the second MOS transistor are connected to a second power supply.

The gate of the first MOS transistor is served as an input terminal of a voltage based on the first power supply, and the source of the second MOS transistor is served as an output terminal of a voltage based on the second power supply.

Either one of the first power supply or the second power supply is the lower potential power supply, and the other is the higher potential power supply.

According to this construction, a voltage signal based on the first power supply inputted to the foregoing input terminal is converted into a voltage signal based on the second power supply, in which the phase alteration of the voltage signal inputted to the input terminal is inverted and outputted from the foregoing output terminal.

In this phase and base potential converter, it is preferable that the foregoing first MOS transistor and the second MOS transistor are formed in two diffusion regions separately located on a semiconductor substrate.

Further, it is preferable that the semiconductor substrate is formed of an n-type semiconductor substrate, the foregoing two separate diffusion regions each are formed of p-type diffusion regions, and the foregoing first MOS transistor and the second MOS transistor are formed of n-channel MOS transistors.

Further, the temperature-compensated crystal oscillator according to this invention is provided with a phase and base potential converter, a temperature compensation signal generator, a signal composition circuit, a frequency adjusting circuit, and a crystal oscillating circuit.

Further, a frequency control signal from outside based on the first power supply is inputted to the foregoing phase and base potential converter and converted into a frequency control signal based on the second power supply.

A temperature compensation signal that the foregoing temperature compensation signal generator generates and the frequency control signal based on the second power supply converted by the foregoing phase and base potential converter are synthesized by the signal composition circuit.

In accordance with the signal thus synthesized, the frequency adjusting circuit adjusts the oscillation frequency of the crystal oscillating circuit.

The above and other objects, features and advantages of the invention will be apparent from the following detailed description which is to be read in conjunction with the accompanying drawings.

DETAILED DESCRIPTION OF THE PREFERRED EMBODIMENTS

Preferred embodiments of the invention will hereafter be described in detail with reference to the accompanying drawings.

First Embodiment of the Phase and Base Potential Converter

Figure 1:
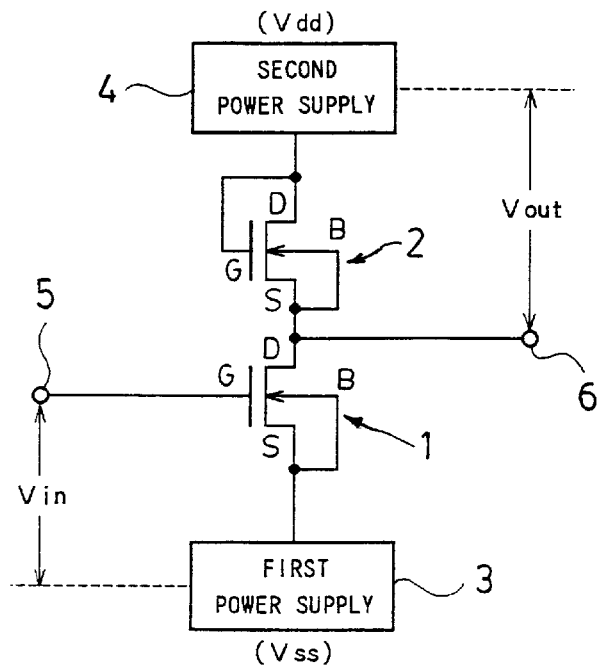
FIG. 1 is a circuit diagram to illustrate the construction of a first embodiment of a phase and base potential converter according to the invention.

FIG. 1 is a circuit diagram to illustrate the construction of a first embodiment of a phase and base potential converter according to the invention. This embodiment employs n-channel MOS transistors as the MOS transistor.

As shown in FIG. 1, this phase and base potential converter has a first n-channel MOS transistor 1 and a second n-channel MOS transistor 2 connected in series between a first power supply 3 and a second power supply 4.

The first and second n-channel MOS transistors 1, 2 are n-channel MOS transistors that have four terminals of the source (S), drain (D), gate (G), bulk (B), and an identical size and characteristic.

The source and bulk of the first n-channel MOS transistor 1 are connected to the first power supply 3, the source and bulk of the second n-channel MOS transistor 2 are connected to the drain of the first n-channel MOS transistor 1, and the gate and drain of the second n-channel MOS transistor 2 are connected to the second power supply 4.

The gate of the first n-channel MOS transistor 1 is served as an input terminal 5 of a voltage based on the first power supply 3, and the source of the second n-channel MOS transistor 2 is served as an output terminal 6 of a voltage based on the second power supply 4.

That the circuit shown in FIG. 1 is a phase and base potential converter will now be described.

That is, the first n-channel MOS transistor 1 and the second n-channel MOS transistor 2 are connected in series between the first power supply 3 and the second power supply 4; and therefore, the current across the drain-source of the one transistor is equal to that of the other.

Generally, the current across the drain-source of the MOS transistor is uniquely determined by the voltage across the gate-source, if the size and the threshold voltage are identical.

Conversely, if the currents across the drain-source of such MOS transistors are equal, the voltages across the gate-source of both are equal as well.

The first n-channel MOS transistor 1 and the second n-channel MOS transistor 2 in this circuit have the same size and characteristic. Therefore, the voltage across the gate-source of the first n-channel MOS transistor 1 becomes equal to the voltage across the gate-source of the second n-channel MOS transistor 2.

Further, the source of the first n-channel MOS transistor 1 is connected to the first power supply 3, and the gate of the second n-channel MOS transistor 2 is connected to the second power supply 4. Therefore, the voltage (Vin) between the gate of the first n-channel MOS transistor 1 and the first power supply 3 is equal to the voltage (Vout) between the second power supply 4 and the source of the second n-channel MOS transistor 2. However, the phase alteration is inverted.

That is, when the voltage based on the first power supply 3 is inputted to the gate of the first n-channel MOS transistor 1, the voltage based on the second power supply 4 is outputted from the source of the second n-channel MOS transistor 2, of which the absolute value is equal to that of the input voltage and the phase alteration is inverted with respect to that of the input voltage. This represents the conversion operation of the phase and base potential.

Therefore, the circuit construction shown in FIG. 1 represents a phase and base potential converter.

The phase and base potential converter shown in FIG. 1 is constructed with n-channel MOS transistors, the first power supply 3 is the power supply Vss (ground potential) on the lower potential side, and the second power supply 4 is the power supply Vdd (Vcc) on the higher potential side.

In other words, this phase and base potential converter is a circuit to convert the Vss base system into the Vdd base system.

Incidentally, as shown in FIG. 1, the bulk of the second n-channel MOS transistor 2 is connected to, not the bulk but, the drain of the first n-channel MOS transistor 1.

To realize such a connection in one semiconductor substrate, the p-type diffusion region where the first n-channel MOS transistor 1 is formed must be separated from the p-type diffusion region where the second n-channel MOS transistor 2 is formed.

Accordingly, in the phase and base potential converter constructed with n-channel MOS transistors, it is necessary to form the n-type semiconductor substrate as the starting material, form two p-type diffusion regions separately located on the surface thereof, form the first n-channel MOS transistor on one of the p-type diffusion regions, and form the second n-channel MOS transistor on the other.

The separation of the p-type diffusion regions in this manner is referred to as well separation, which is generally employed in the production of common semiconductor integrated circuits.

Note that the MOS transistor is not a special component, but is a common component in semiconductor integrated circuits.

Therefore, the phase and base potential converter according to this invention can easily be incorporated in a CMOS integrated circuit.

Second Embodiment of the Phase and Base Potential Converter

The foregoing first embodiment is the phase and base potential converter that converts the Vss base system into the Vdd base system; on the contrary, the phase and base potential converter that converts the Vdd base system into the Vss base system can also be constructed.

Figure 2:
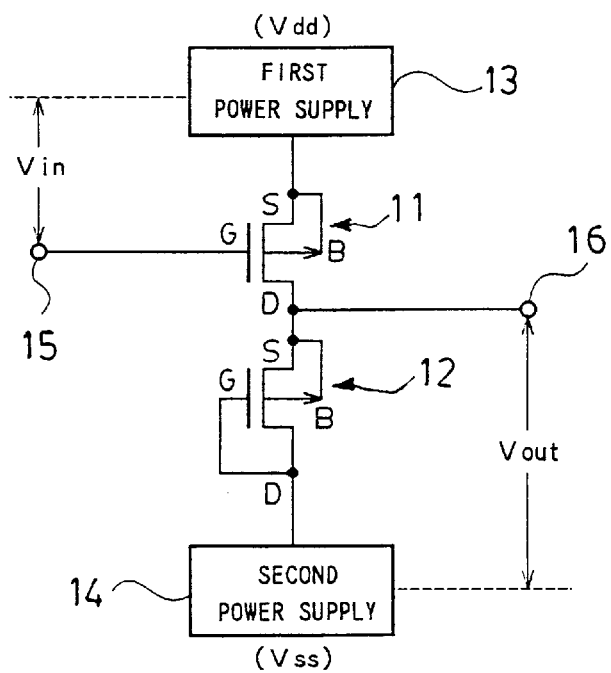
FIG. 2 is a circuit diagram to illustrate the construction of a second embodiment of the phase and base potential converter according to the invention.

FIG. 2 is a circuit diagram to illustrate the construction of a second embodiment of a phase and base potential converter according to the invention. This embodiment is the phase and base potential converter that converts the Vdd base system into the Vss base system, which employs p-channel MOS transistors as the MOS transistor.

As shown in FIG. 2, this phase and base potential converter has a first p-channel MOS transistor 11 and a second p-channel MOS transistor 12 connected in series between a first power supply 13 and a second power supply 14.

The first and second p-channel MOS transistors 11, 12 are p-channel MOS transistor having four terminals of the source (S), drain (D), gate (G), and bulk (B), and have the same size and characteristic.

The source and bulk of the first p-channel MOS transistor 11 are connected to the first power supply 13, the source and bulk of the second p-channel MOS transistor 12 are connected to the drain of the first p-channel MOS transistor 11, and the gate and drain of the second p-channel MOS transistor 12 are connected to the second power supply 14.

The gate of the first p-channel MOS transistor 11 is served as an input terminal 15 of a voltage based on the first power supply 13, and the source of the second p-channel MOS transistor 12 is served as an output terminal 16 of a voltage based on the second power supply 14.

Here, the first power supply 13 is the power supply (Vcc or Vdd) on the higher potential, and the second power supply 14 is the power supply (ground potential or Vss) on the lower potential.

Also in the phase and base potential converter shown in FIG. 2, the first p-channel MOS transistor 11 and the second p-channel MOS transistor 12 are connected in series between the first power supply 13 and the second power supply 14; and therefore, the current across the drain-source of the one transistor is equal to that of the other.

The first p-channel MOS transistor 11 and the second p-channel MOS transistor 12 have the same size and the same characteristic. Therefore, the voltages across the gate-source of both the MOS transistors become equal.

Also, the source of the first p-channel MOS transistor 11 is connected to the first power supply 13, and the gate of the second p-channel MOS transistor 12 is connected to the second power supply 14.

Therefore, the voltage (Vin) between the gate of the first p-channel MOS transistor 11 and the first power supply 13 is equal to the voltage (Vout) between the second power supply 14 and the source of the second p-channel MOS transistor 12. However, the phase alteration is inverted.

That is, when the voltage based on the first power supply 13 (Vdd base system) is inputted to the gate of the first p-channel MOS transistor 11, a voltage based on the second power supply 14 (Vss base system) is outputted from the source of the second p-channel MOS transistor 12, of which the absolute value is equal to that of the input voltage.

That is, this phase and base potential converter is a circuit to convert the Vdd base system into the Vss base system.

Embodiment of the Temperature-Compensated Crystal Oscillator

Next, one embodiment of a temperature-compensated crystal oscillator employing a phase and base potential converter according to the invention will be described.

Figure 3:
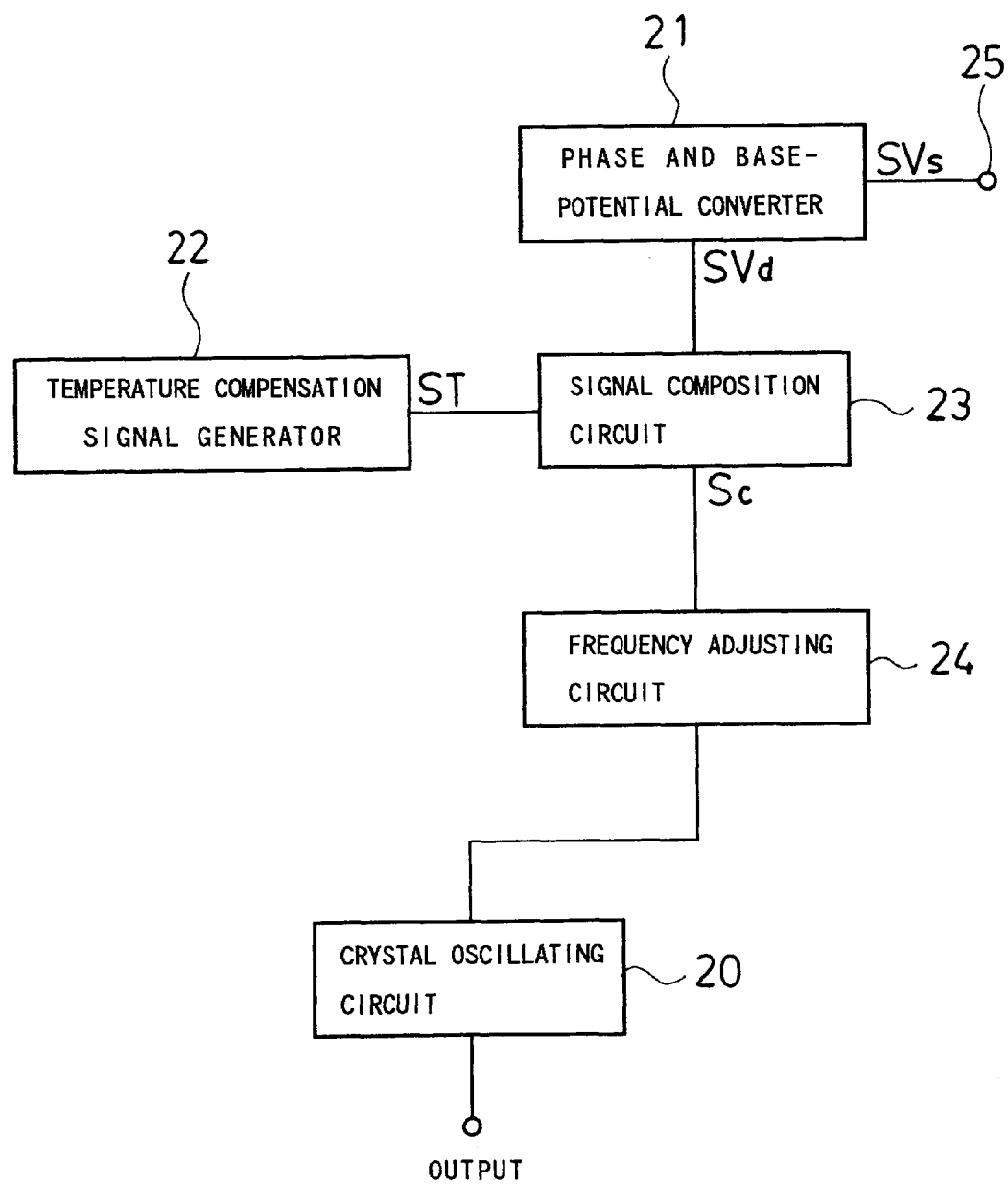
FIG. 3 is a block diagram to illustrate the construction of an embodiment of a temperature-compensated crystal oscillator according to the invention.

FIG. 3 is a block diagram to illustrate the construction of the embodiment of the temperature-compensated crystal oscillator according to the invention.

The temperature-compensated crystal oscillator is provided with a crystal oscillating circuit 20 using an AT-cut crystal unit, a phase and base potential converter 21 that converts an external frequency control signal based on the Vss into a frequency control signal based on the Vdd, a temperature compensation signal generator 22 that generates a temperature compensation signal based on the Vdd, a signal composition circuit 23 that outputs to synthesize the temperature compensation signal based on the Vdd with the frequency control signal based on the Vdd converted by the phase and base potential converter 21, and a frequency adjusting circuit 24 that adjusts the oscillation frequency of the crystal oscillating circuit 20 in accordance with the signal synthesized by the signal composition circuit 23.

The phase and base potential converter 21 has two n-channel MOS transistors connected in series, in the same manner as the phase and base potential converter as shown in FIG. 1 according to the invention, and the phase and base potential converter 21 converts and outputs a frequency control signal SVs based on the Vss inputted from an input terminal 25 into a frequency control signal SVd based on the Vdd.

Further, the temperature compensation signal ST of the Vdd base outputted from the temperature compensation signal generator 22 and the frequency control signal SVd based on the Vdd converted by the phase and base potential converter 21 are synthesized by the signal composition circuit 23. In accordance with the composite signal Sc thus synthesized, the frequency adjusting circuit 24 adjusts the oscillation frequency of the crystal oscillating circuit 20.

These circuits can be incorporated in a semiconductor integrated circuit of the complementary field effect transistor (CMOS) of the Vdd base system.

Thus, applying the phase and base potential converter makes it possible to construct the temperature-compensated crystal oscillator used in the environment of the Vss base system with a CMOS integrated circuit of the Vdd base system.

That is, to construct the temperature-compensated crystal oscillator with a CMOS integrated circuit of the Vdd base system and convert a frequency control signal of the Vss base system into a frequency control signal of the Vdd base system by using the phase and base potential converter will remove the conflict in the signal composition with the temperature compensation signal.

Accordingly, this embodiment will not sacrifice the oscillation characteristic nor the signal composition, and achieves an excellent quality temperature-compensated crystal oscillator.

Incidentally, using a range where the input of the frequency adjusting circuit 24 is in a linear relation to the frequency variation of the crystal oscillating circuit 20, the signal composition circuit 23 is able to effect a parallel translation in the temperature compensation signal ST by the frequency control signal SVd based on the Vdd; and thereby effective signal composition can be performed.

Figure 4:
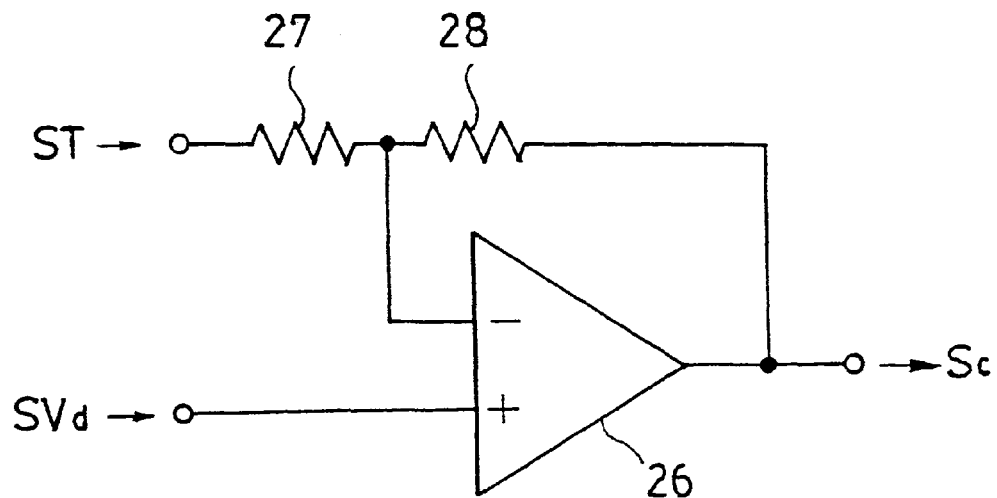
FIG. 4 is a circuit diagram to illustrate one example of a signal composition circuit 23 in FIG. 3.

Such a signal composition can be achieved by using an inverting amplifier, for example as shown in FIG. 4, which is made up with an operational amplifier 26, input resistor 27, and feedback resistor 28, which receives the temperature compensation signal ST as the input and the frequency control signal SVd based on the Vdd as the inverting point.

Figure 5:
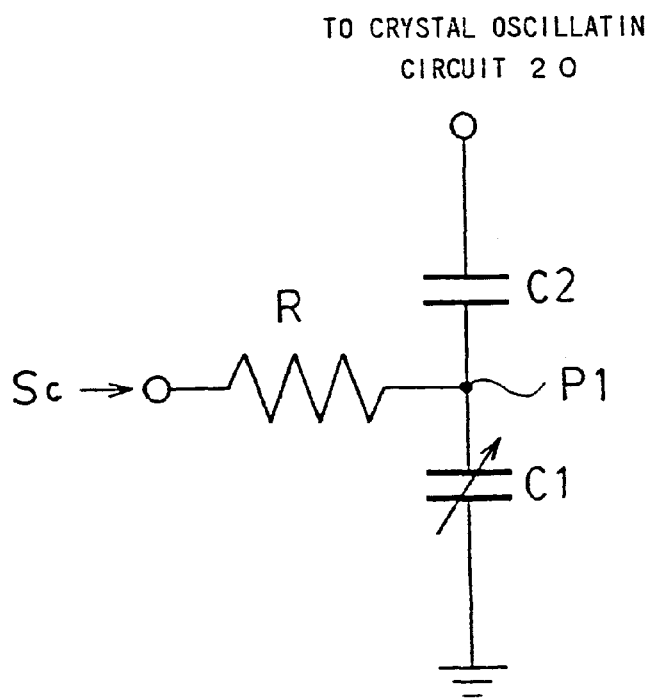
FIG. 5 is a circuit diagram to illustrate one example of the frequency adjusting circuit 24 in FIG. 3.

Also, the frequency (adjusting circuit 24 can be made up, for example, with a variable capacitance circuit as shown in FIG. 5.

This variable capacitance circuit comprises a variable capacitance element C1 and a DC decoupling capacitor C2 connected in series; and this series circuit is connected with the crystal oscillating circuit 20 in FIG. 3 as a load to adjust the oscillation frequency thereof.

In order to control the capacitance of the variable capacitance element C1, the composite signal Sc from the signal composition circuit 23 is applied to the connection point P1 of the variable capacitance element C1 and the capacitor C2 through the resistor R.

This example shown in FIG. 5 is an extremely general type of variable capacitance circuit; however, when this is used for the temperature-compensated crystal oscillator, there are some restrictions on these elements.

That is, as the variable capacitance element C1, any voltage-controlled capacitor can be used; however, for ease of incorporation into a semiconductor integrated circuit, a MOS-type capacitor is preferable. Further, in the example shown in FIG. 5, one connection end of the variable capacitance element C1 is the ground; however, since the DC potential of the connection end is unconditioned, the variable capacitance element C1 may be connected to a connection end of an arbitrary potential that gives a large variation range of capacitance.

The DC decoupling capacitor C2 is preferably a capacitor that does not depend on voltage. However, if the capacitance is larger than the variable capacitance element C1, this, condition is not essential. Rather important is the condition that the stray capacitance be extremely low in order not to reduce the variation range of the capacitance of the variable capacitance element C1.

The input resistor R needs about 1 M Ω. However, to form the resistor with an element having a large stray capacitance will lead to reducing the variation range of the capacitance of the variable capacitance element C1, and therefore, a diffusion resistor or a MOS resistor is not preferable. In view of the incorporation into a semiconductor integrated circuit, a polycrystal silicon resistor is most preferable.

Further, in the temperature-compensated crystal oscillator shown in FIG. 3, the external frequency control signal SVs is directly inputted to the phase and base potential converter 21, and the frequency control signal SVd based on the Vdd being the output thereof is directly synthesized with the temperature compensation signal ST. However, it is also possible to reduce the contribution by the external frequency control signal, by providing a proportional reduction circuit either on the input or on the output of the phase and base potential converter 21.

Effect of the Invention

The phase and base potential converter according to the invention is able to convert, employing a simple circuit, a voltage using one power supply with either the lower potential (Vss) or the higher potential (Vdd) as the base into a voltage using the other power supply as the base.

Therefore, as in a temperature-compensated crystal oscillator mounted on a portable telephone or the like, if the phase and base potential converter according to the invention is incorporated into a crystal oscillator, etc., of the Vdd base system used in the environment of the Vss base system, the phase and base potential converter is able to convert the external control signal so as to comply with the base system in use, which produces a significant effect.

Furthermore, not only in case of the temperature-compensated crystal oscillator, to incorporate the phase and base potential converter according to the invention into a voltage-controlled crystal oscillator (VCO), for example, makes it possible to control the crystal oscillator of the Vdd base system by a control voltage of the Vss base system, which presents an extremely advantageous effect.

What is claimed is:

1. A phase and base potential converter including a first MOS transistor having four terminals of a source, drain, gate, and bulk, and a second MOS transistor having the same size and characteristic as the first MOS transistor, wherein:

the source and bulk of the first MOS transistor are connected to a first power supply;

the source and bulk of the second MOS transistor are connected to the drain of the first MOS transistor;

the gate and drain of the second MOS transistor are connected to a second power supply;

the gate of the first MOS transistor is served as an input terminal of a voltage based on the first power supply;

the source of the second MOS transistor is served as an output terminal of a voltage based on the second power supply; and one of the first power supply or the second power supply is a lower potential power supply, and the other is a higher potential power supply.

2. A phase and base potential converter as claimed in claim 1, wherein the first MOS transistor and the second MOS transistor are formed in two separate diffusion regions on a semiconductor substrate.

3. A phase and base potential converter as claimed in claim 2, wherein:

the semiconductor substrate is formed of an n-type semiconductor substrate, each of the two separate diffusion regions is formed of a p-type diffusion region, and the first MOS transistor and the second MOS transistor are formed of n-channel MOS transistors.

4. A temperature-compensated crystal oscillator including a phase and base potential converter that inputs a frequency control signal based on a first power supply and converts it into a frequency control signal based on a second power supply, a temperature compensation signal generator that generates a temperature compensation signal based on the second power supply, a signal composition circuit that synthesizes the temperature compensation signal generated by the temperature compensation signal generator with the frequency control signal based on the second power supply converted by the phase and base potential converter, a crystal oscillating circuit, and a frequency adjusting circuit that adjusts an oscillation frequency of the crystal oscillating circuit in accordance with a signal synthesized by the signal composition circuit, wherein:

the phase and base potential converter includes a first MOS transistor having four terminals of a source, drain, gate, and bulk, and a second MOS transistor having the same size and characteristic as the first MOS transistor, and further wherein:

the source and bulk of the first MOS transistor are connected to a first power supply;

the source and bulk of the second MOS transistor are connected to the drain of the first MOS transistor;

the gate and drain of the second MOS transistor are connected to a second power supply;

the gate of the first MOS transistor is served as an input terminal of the frequency control signal based on the first power supply;

the source of the second MOS transistor is served as an output terminal of the frequency control signal based on the second power supply; and one of the first power supply or the second power supply is a lower potential power supply, and the other is a higher potential power supply.

5. A temperature-compensated crystal oscillator as claimed in claim 4, wherein the first MOS transistor and the second MOS transistor are formed in two separate diffusion regions on a semiconductor substrate.

6. A temperature-compensated crystal oscillator as claimed in claim 5, wherein:

the semiconductor substrate is formed of an n-type semiconductor substrate, each of the two separate diffusion regions is formed of a p-type diffusion region, the first MOS transistor and the second MOS transistor are formed of n-channel MOS transistors, and the first power supply is the lower potential power supply, and the second power supply is the higher potential power supply.

* * * * *